United States Patent
Mitard et al.

(10) Patent No.: US 9,478,544 B2
(45) Date of Patent: Oct. 25, 2016

(54) METHOD FOR FORMING A GERMANIUM CHANNEL LAYER FOR AN NMOS TRANSISTOR DEVICE, NMOS TRANSISTOR DEVICE AND CMOS DEVICE

(71) Applicant: IMEC VZW, Leuven (BE)

(72) Inventors: Jerome Mitard, Bossut-Gottechain (BE); Roger Loo, Leuven (BE); Liesbeth Witters, Linden (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 14/809,089

(22) Filed: Jul. 24, 2015

(65) Prior Publication Data

US 2016/0027780 A1 Jan. 28, 2016

(30) Foreign Application Priority Data

Jul. 25, 2014 (EP) .................................... 14178468

(51) Int. Cl.
*H01L 27/092* (2006.01)
*H01L 21/02* (2006.01)
(Continued)

(52) U.S. Cl.
CPC ....... *H01L 27/0922* (2013.01); *H01L 21/0245* (2013.01); *H01L 21/02381* (2013.01); *H01L 21/02516* (2013.01); *H01L 21/02532* (2013.01); *H01L 21/02609* (2013.01);
(Continued)

(58) Field of Classification Search
CPC ............... H01L 27/0922; H01L 21/02381; H01L 21/02532; H01L 21/02609; H01L 21/02645; H01L 21/823807; H01L 21/823814; H01L 21/823821; H01L 27/0924; H01L 29/045; H01L 29/0653; H01L 29/165; H01L 29/66636; H01L 29/7848
USPC ........................................................ 257/190
See application file for complete search history.

(56) References Cited

U.S. PATENT DOCUMENTS

| | | | |
|---|---|---|---|
| 2004/0178406 A1* | 9/2004 | Chu .................. | H01L 21/02381 257/19 |
| 2005/0014315 A1* | 1/2005 | Yamamoto ........ | H01L 29/66772 438/166 |

(Continued)

OTHER PUBLICATIONS

Yang et al., Appl. Phys. Lett. 91, 102103 (2007).*
(Continued)

*Primary Examiner* — Fernando L Toledo
*Assistant Examiner* — Adam S Bowen
(74) *Attorney, Agent, or Firm* — Knobbe, Martens, Olson & Bear LLP

(57) ABSTRACT

The disclosed technology generally relates to complementary metal-oxide-silicon (CMOS) devices, and more particularly to a transistor device comprising a germanium channel layer, such as an n-channel metal-oxide-silicon (NMOS) transistor device. In one aspect, a method of forming a germanium channel layer for an NMOS transistor device comprises providing a trench having sidewalls defined by a dielectric material structure and abutting on a silicon substrate's surface, and growing a seed layer in the trench on the surface, where the seed layer has a front surface comprising facets having a (111) orientation. The method additionally includes growing a strain-relaxed buffer layer in the trench on the seed layer, where the strain-relaxed buffer layer comprises silicon germanium. The method further includes growing a channel layer comprising germanium (Ge) on the strain-relaxed buffer layer. In other aspects, devices, e.g., an NMOS transistor device and a CMOS device, includes features fabricated using the method.

19 Claims, 6 Drawing Sheets

(51) Int. Cl.
*H01L 29/165* (2006.01)
*H01L 29/78* (2006.01)
*H01L 21/8238* (2006.01)
*H01L 29/04* (2006.01)

(52) U.S. Cl.
CPC .............. *H01L 21/02645* (2013.01); *H01L 21/823807* (2013.01); *H01L 21/823814* (2013.01); *H01L 21/823821* (2013.01); *H01L 27/0924* (2013.01); *H01L 29/165* (2013.01); *H01L 29/7848* (2013.01); *H01L 29/045* (2013.01)

(56) References Cited

U.S. PATENT DOCUMENTS

| | | | | |
|---|---|---|---|---|
| 2009/0283829 | A1* | 11/2009 | Dyer | H01L 29/785 257/351 |
| 2013/0285153 | A1* | 10/2013 | Lee | H01L 21/02532 257/369 |
| 2014/0008700 | A1* | 1/2014 | Rachmady | H01L 29/66431 257/192 |
| 2015/0318176 | A1* | 11/2015 | Qi | H01L 21/26513 438/283 |
| 2015/0340500 | A1* | 11/2015 | Brunco | H01L 21/76224 257/190 |

OTHER PUBLICATIONS

Loo, Roger, et al. "Ge1-xSnx materials: Challenges and applications." ECS Journal of Solid State Science and Technology 2.1 (2013): N35-N40.*

Hikavyy, A., et al. "High Ge Content SiGe Selective Processes for Source/Drain in Manufacturing the Next Generations of pMOS Transistors." ECS Journal of Solid State Science and Technology 2.6 (2013): p. 282-p. 286.*

Vincent, Benjamin, et al. "Selective growth of strained Ge channel on relaxed SiGe buffer in shallow trench isolation for high mobility Ge planar and FIN p-FET." ECS Transactions 50.9 (2013): 39-45.*

Lee, C.H. et al. "Thermally Robust CMOS-aware Ge MOSFETs with High Mobility at High-carrier Densities on a Single Orientation Ge Substrate," 2014 Symposium on VLSI Technology Digest of Technical Papers.

Yang, Y.J. et al. "Electron mobility enhancement in strained-germanium n-channel metal-oxide-semiconductor field-effect transistors," Applied Physics Letters 91, 102103 (2007).

* cited by examiner

METHOD FOR FORMING A GERMANIUM CHANNEL LAYER FOR AN NMOS TRANSISTOR DEVICE, NMOS TRANSISTOR DEVICE AND CMOS DEVICE

CROSS-REFERENCE TO RELATED APPLICATIONS

This application claims foreign priority to European patent application EP 14178468.6, filed Jul. 25, 2014, the content of which is incorporated by reference herein in its entirety.

BACKGROUND

1. Field

The disclosed technology generally relates to complementary metal-oxide-silicon (CMOS) devices, and more particularly to a transistor device comprising a germanium channel layer, such as an n-channel metal-oxide-silicon (NMOS) transistor device and related devices.

2. Description of the Related Technology

In some complimentary metal-oxide-silicon (CMOS) technologies, an n-channel metal-oxide-silicon (NMOS) device and a p-channel metal-oxide-silicon (PMOS) device that are under different types of strains are used. For example, a combination of tensile-strained/unstrained and compressively strained channel structures may be formed on a single substrate for NMOS and PMOS transistor devices, respectively. The different types of strains are employed, e.g., to improve carrier mobilities of the NMOS and PMOS devices.

A prior art solution is to provide different channel materials for the tensile-strained and compressively strained channel structures (channel layers).

At advanced technological nodes, there exists definitely a need for channel materials having a higher mobility than the conventional strained and unstrained Si channel reference device, aiming at further boosting the device performance. However, using different channel materials, e.g., Ge-based materials for PMOS and III-V-based materials for NMOS, can be technologically difficult and expensive.

In many aspects, e.g., the relative compatibility with silicon-based processes, using a germanium-based channel material is advantageous.

In Yang, Appl. Phys. Lett. 91, 102103 (2007), (111) Ge surface properties have been reported as having improved electron transport at any channel strain conditions as compared to the sidewall (110) or top (100) Ge surface.

However, there exists a need for methods which allow manufacturing both tensile-strained and compressively strained channel structures using the same channel material on a substrate, such as for instance a germanium-based channel material.

A big challenge here is the production of Ge n-channel devices. Indeed, relaxed Ge fins having very low defect density are needed for high intrinsic electron mobility. In conventional planar Ge nFETs (e.g. with (100)-Ge as a dominant carrier transport plane), a poor mobility using standard gate stacks has been extensively reported. As a most recent example, C. H. Lee al. at VLSI 2014, technology symposium, page 144 from proceeding (technology symposium)) reported a value of 300 $cm^2/V \cdot s$ for the mobility while on (111)-oriented surface (planar) the mobility can exceed 400 $cm^2/V \cdot s$.

SUMMARY OF CERTAIN INVENTIVE ASPECTS

It is an aim of the present disclosure to provide a method for manufacturing an NMOS transistor device, or a germanium channel layer for an NMOS transistor device, whereby relaxed Ge fin structures having low defect density (e.g., lower than $1E8/cm^3$) are produced, which moreover have a high carrier mobility (e.g., higher than 50 $cm^2/V \cdot s$ for holes and higher than 100 $cm^2/V \cdot s$ for electrons).

This aim is achieved according to the disclosure with the method showing the technical characteristics of the first independent claim.

According to a first aspect of the present disclosure, a method for forming a germanium channel layer for an NMOS transistor device is disclosed, the method comprising:

a. providing a trench (a first trench) having sidewalls defined by a dielectric material structure and abutting on a silicon substrate's surface, which preferably has a (001) orientation;

b. growing a seed layer in the trench on the surface, the seed layer having a front surface comprising facets having a (111) orientation;

c. growing a strain-relaxed buffer in the trench on the seed layer, the strain-relaxed buffer layer comprising silicon germanium; and d. growing a channel layer comprising germanium (Ge) on the strain-relaxed buffer layer.

It is an advantage that the seed layer promotes the formation of a (111) faceted front surface during the subsequent deposition of the strain-relaxed buffer layer. In various embodiments, the substrate is a semiconductor substrate, e.g., a silicon substrate, which includes dielectric material structures, e.g., shallow trench isolation (STI) structures formed of, e.g., silicon oxide. Providing trenches in the substrate having STI structures formed therein comprises recessing respective silicon protrusions, e.g., fins, located between a respective pair of adjacent STI structures.

According to embodiments, the top surface of the seed layer does not consist of (111)-facets only. It has been found that the specific facets that may be formed by the surface of the seed layer depends on the trench width, among other factors. Also the thickness of the seed layer, preferably within a range of 5 nm to 60 nm, may determine the eventual faceting nature of the seed layer. For narrow trenches, having a width smaller than 100 nm, more preferably smaller than 50 nm, more preferably smaller than 30 nm, only (111) facets may be formed at the front surface of the seed layer. For both narrow and wide trenches, the latter e.g. having a width larger than 100 nm, the edge of the top surface will grow (111)-facetted, while near the central portion or central position in between the two longitudinal sidewalls of the trench, the surface may have another orientation, e.g. may still have a (001) orientation, especially for wide trenches.

Without being bound to any theory, it will be recognized that the driving force for (111) facet formation is the high interface energy between the dielectric material and the SiGe or Ge semiconductor layer. In this aspect, the formation of (111) facets can be facilitated by for instance increasing the Ge content in the seed layer, or by using a 100% Ge seed layer, which results in an increase of the surface diffusivity of the growing atoms. Alternatively, the formation of (111) facets can facilitated by offering sufficient kinetic energy which also allows the surface atoms to move away from the dielectric. This can be done by growing the seed layer at a sufficiently high temperature, for instance within the range of 350 to 900° C., or by applying a growth interruption between the depositions of a seed layer and a strain-relaxed buffer (SRB) layer, e.g. a SiGe SRB, the latter possibly combined with a further facet formation stimulating process. The critical temperature, at which facet formation starts, reduces with increasing Ge content and is lower if the growth is interrupted. This critical temperature may also depend on the dielectric (trench sidewall) materials.

According to embodiments, the method further comprises applying a temperature step before growing the strain-relaxed buffer layer, preferably in an inert gas atmosphere. For instance in an $N_2$ environment, the temperature is preferably higher or equal than 350° C., more preferable higher or equal than 400° C. For instance in a $H_2$ environment, the temperature is preferably higher or equal than 400° C., more preferable higher or equal than 450° C.

According to embodiments, the seed layer is a germanium-based seed layer. It may comprise or consist of SiGe, more preferably it may comprise or consist of Ge.

According to embodiments, the strain-relaxed buffer layer is SiGe-based. Its upper (front) surface will comprise facets having a (111) orientation. Its front surface will predominantly have surfaces with (111) orientation. At least the edge region of the front surface of the SRB layer will have a (111) orientation. The germanium content of the SRB layer is preferably between 50% and 90%, more preferably between 70% and 80%. Preferably, the SRB is fully strain-relaxed.

According to embodiments, the method further comprises;
a. providing a second trench having sidewalls defined by a dielectric material structure and abutting on the silicon substrate's surface which defines a bottom surface of the second trench;
b. growing the strain-relaxed buffer layer, preferably at the same time, in both the first trench and the second trench (at this stage, an SRB template ((111) for n-channel FinFETs or nFinFETs and rectangular-shape for p-channel FinFETs or pFinFETs) is ready to be used to grow the channel deposition for both p and nFinFETs); and
c. growing a channel layer comprising germanium on the strain-relaxed buffer layer in the first trench and in the second trench, preferably at the same time.

According to embodiments, the method further comprises providing a capping layer, capping the seed layer, for instance by an in-situ process like the deposition of a Si-based layer, before providing the second trench (etching a second silicon protrusion in between STI structures). This capping layer may act as a protection against chemical treatment used during further fabrication of CMOS devices.

This method offers the opportunity of the simultaneous formation of a single SRB layer and common channel layer both NMOS and PMOS devices.

According to embodiments, the silicon trenches (e.g. NMOS and PMOS trenches) are recessed such that the final thicknesses of the respective fin structures (comprising Ge seed, SRB layer and the channel layer) is controlled.

According to embodiments, the method comprises providing the trench and the second trench comprises recess etching of silicon protrusions on an STI substrate, and providing the second trench is performed after growing a seed layer in the trench (first trench) on the surface.

According to a second aspect of the present disclosure, an NMOS transistor device is disclosed, comprising:
a trench having sidewalls defined by a dielectric material structure and abutting on a silicon substrate's surface;
a seed layer in the trench on the surface, the seed layer having a front surface comprising facets having a (111) orientation;
a strain-relaxed buffer layer in the trench on the seed layer, the strain-relaxed buffer layer comprising silicon germanium; and
a channel layer comprising germanium (Ge) on the strain-relaxed buffer layer, the channel layer having a (111) orientation in the trench.

According to embodiments, the seed layer is a SiGe or germanium seed layer.

According to a third aspect of the present disclosure, a CMOS device is disclosed comprising a NMOS transistor device according to any of the embodiments of the second aspect, and further comprising a PMOS device, the PMOS device comprising
a second trench having sidewalls defined by a dielectric material structure and abutting on the silicon substrate's surface which defines a bottom surface of the second trench;
the strain-relaxed buffer layer in the second trench;
the channel layer comprising germanium on the strain-relaxed buffer layer in the second trench, the channel layer having a (110) sidewall orientation and (001) top surface orientation.

Aspects of the present invention provide several advantages. In epitaxial growth context, an advantage is that, at end of fin process, (111) facetted Ge channel are produced using conventional and existing CMOSFETs platform. Moreover, when the Ge seed layer concept is used, preferably for nFinFETs, the fin shape of pFinFETs for instance can be kept (e.g. predominantly (110) sidewalls for pFinFET). The shape of the final channel materials for both pFinFET and nFinFET can be different and be used advantageously to maximize the device properties (as for instance increase the mobility).

For the purpose of the present disclosure, whenever ranges are defined, it is intended to disclose these ranges in their closed, open, and two half open forms. All these options are meant to be disclosed even if the term "between" is used in the context of defining such ranges.

It will be appreciated by the skilled person that features and advantages described for an aspect of the present invention are also applicable, mutatis mutandis, to the other aspects of the present invention and vice versa and are thereby also considered to be disclosed.

BRIEF DESCRIPTION OF THE DRAWINGS

The disclosure will be further elucidated by means of the following description and the appended figures.

DETAILED DESCRIPTION OF CERTAIN ILLUSTRATIVE EMBODIMENTS

Figure 1:
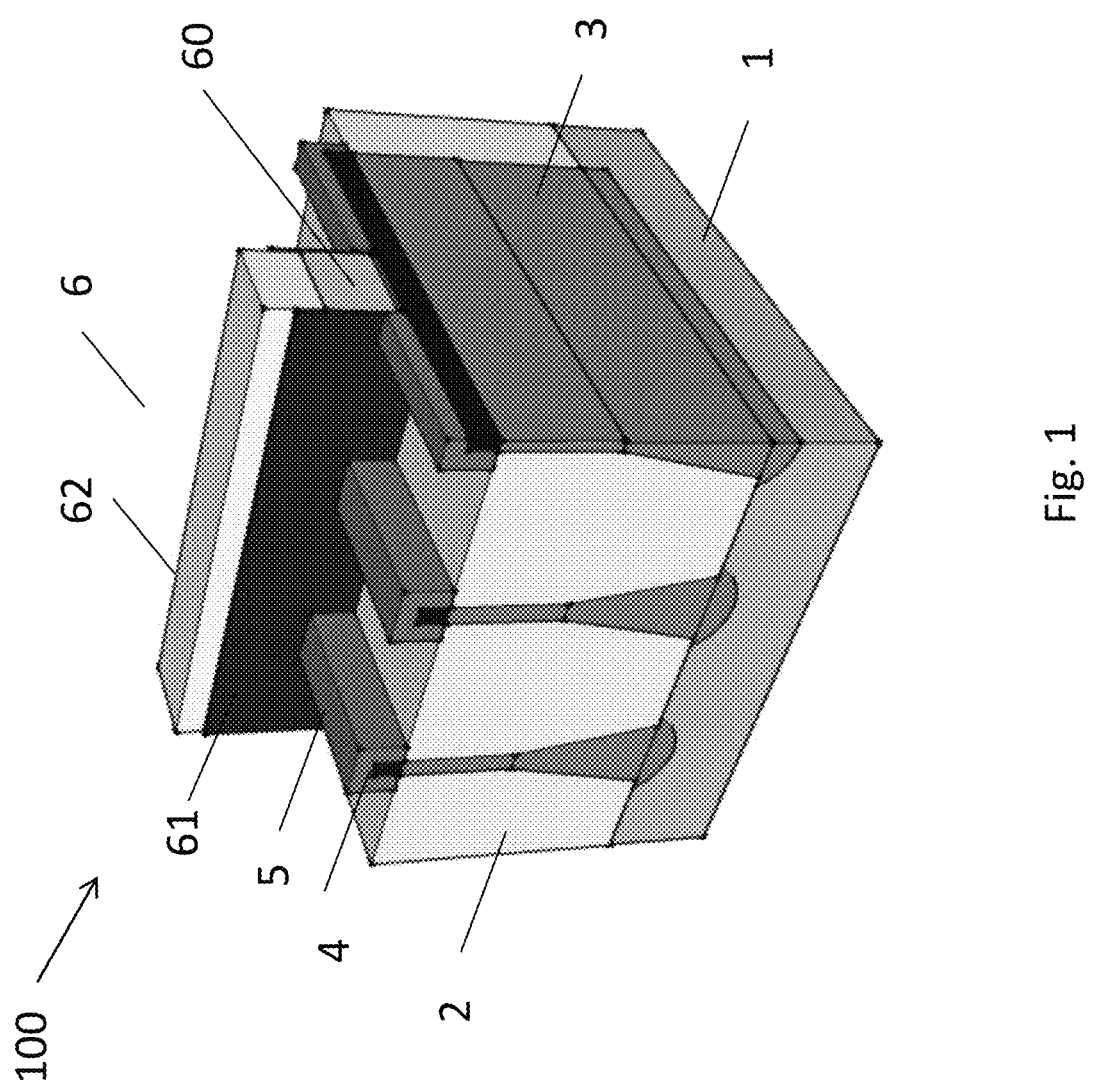
FIG. 1 illustrates a perspective view of a FinFET transistor.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, although referred to as "preferred" are to be construed as exemplary manners in which the disclosure may be implemented rather than as limiting the scope of the disclosure.

Throughout the disclosure, it will be understood that an alloy of two or more materials designated by their constituent elements represents an entire range of compositions. For example, it will be understood that silicon germanium (SiGe) represents $Si_xGe_{1-x}$ in which x is greater than zero and less than one. Likewise, germanium tin (GeSn) represents $Ge_xSn_{1-x}$ in which x is greater than zero and less than one, and silicon germanium tin (SiGeSn) represents $Si_xGe_ySn_{1-x-y}$ in which x and y are each greater than zero and less than one.

Throughout the disclosure, it will be understood that a layer or a material that is "strained" can be partially strained or fully strained. Similarly, it will be understood that a layer or a material that is "strain-relaxed" can be partially strain-relaxed or fully strain-relaxed.

Throughout the disclosure, a letter "s" preceding a material or a layer is used to denote a strained layer, and a letter "r" preceding a material or a layer is used to denote a relaxed layer. For example, sGe denotes a strained Ge layer, and rSiGe denotes a relaxed SiGe layer.

FIG. 1 illustrates a perspective view of a transistor device 100 of the FinFET type. The strained Ge pFinFET structure comprises a strained (stressed) germanium (sGe) channel 4 epitaxially grown on top of a Si1–xGex strain-relaxed buffer (SRB) 3 with $Si_{1-y}Ge_y$ (or $Ge_{1-z}Sn_z$) stressors 5 on the source/drain areas. A gate structure 6 comprising a gate stack 60 and being laterally delimited by spacer structures 61 is provided perpendicularly over the channel 4. The stressors 5 are separated from the gate stack 60 by these spacer structures 61. The $Si_{1-x}Ge_x$ strain-relaxed buffer 3 and channel layers 4 are grown within recessed trenches 10 between shallow trench isolation (STI) structures (in another view, within trenches in a dielectric layer) on the substrate's surface on a silicon substrate. The STI structures are typically formed by etching trenches in a main surface of a silicon wafer or substrate, and afterwards filling these trenches with an oxide. Typically a flattering step, e.g., a chemical-mechanical polishing step, is then performed in order to expose the silicon protrusions in between the oxide-filled trenches (STI structures). The silicon protrusions are then recessed in between the STI structures, and fin structures are grown within the resulting trenches.

Figure 2:
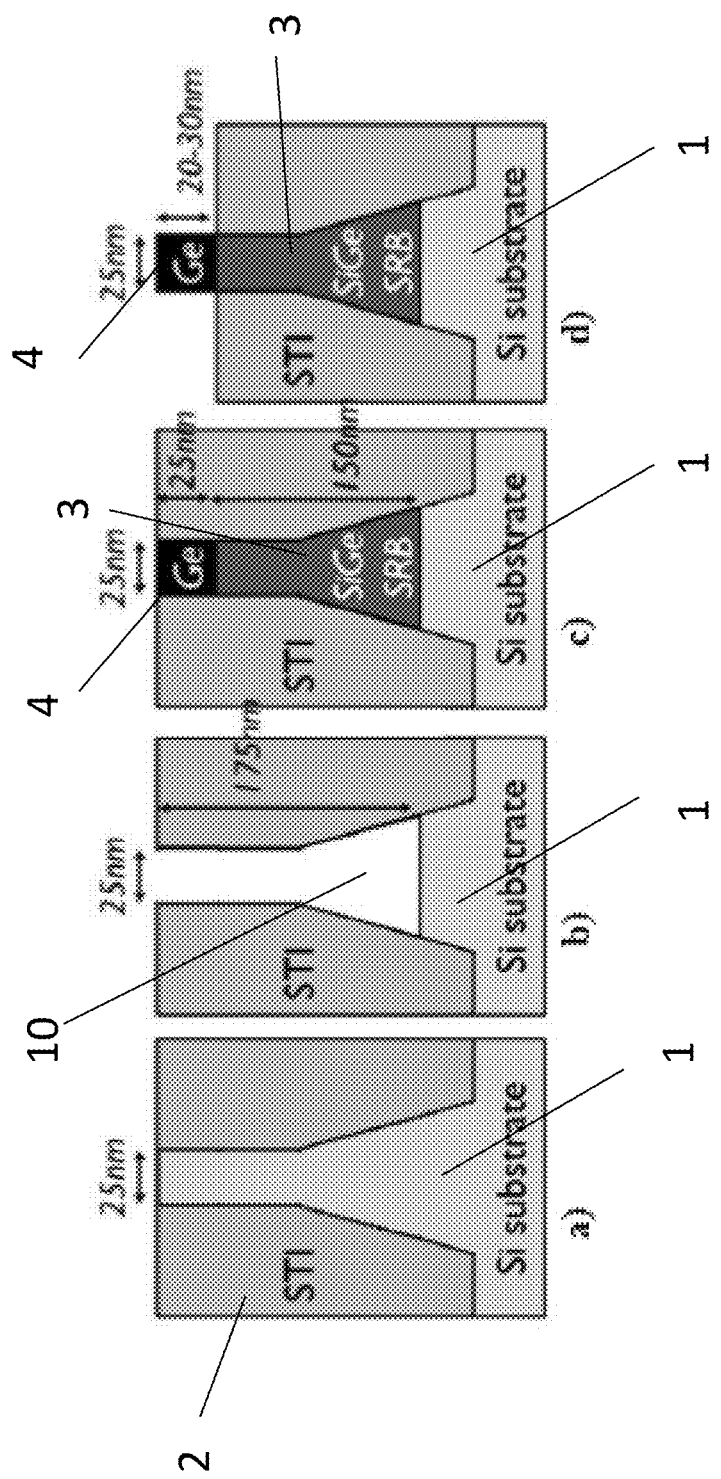
FIG. 2 illustrates a fabrication scheme for the FinFET device as illustrated in FIG. 1.

FIG. 2 illustrates a fabrication scheme for one MOS transistor (called here FinFETs when width is narrower than 100 nm) as illustrated in FIG. 1, which is similar to the scheme used in embodiments of the present disclosure. A $Si_{0.25}Ge_{0.75}$ SRB layer 3 underneath a 20-30 nm high sGe Fin 4 provides a good balance between strain-enhanced mobility and quantum-well confinement on one hand, and limited risk for channel strain relaxation on the other. Starting from a 300 mm bulk Si FinFET (100) wafers (FIG. 2 (a)), a fin replacement process can be used to fabricate the targeted devices. After the removal of the native oxide by an wet HF-treatment and a conventional pre-epi bake, typically 2 min at 800° C., Si can be recessed by in-situ HCl vapor etching (FIG. 2 (b)) resulting in trenches 10 abutting on the silicon surface and which for instance do not extend below the STI structures (or not below the lower surface of the STI structures/dielectric layer). The $Si_{1-x}Ge_x$ SRB layer 3 and the sGe channel 4 can be selectively grown on top of the recessed Si surface (FIG. 2 (c)). Pre-epi bake, Si recess and SiGe/Ge-channel regrowth is done in one sequence. Alternatively, Si-recess can be done ex-situ using a wet-chemical etching solution. The strained Ge fin structures appears after conventional oxide recess (FIG. 2(d)), e.g. by using a conventional wet-chemical treatment in an HF-based solution.

Similar methods and structures are targeted by embodiments of the present invention. The orientation and associated characteristics of the germanium channel layer 4 in the NMOS area are set by providing a seed layer 7 grown on the silicon substrate 1 surface in the trench before epitaxially growing the (e.g. common to NMOS and PMOS) SRB layer 3 and channel layer 4.

Figure 3:
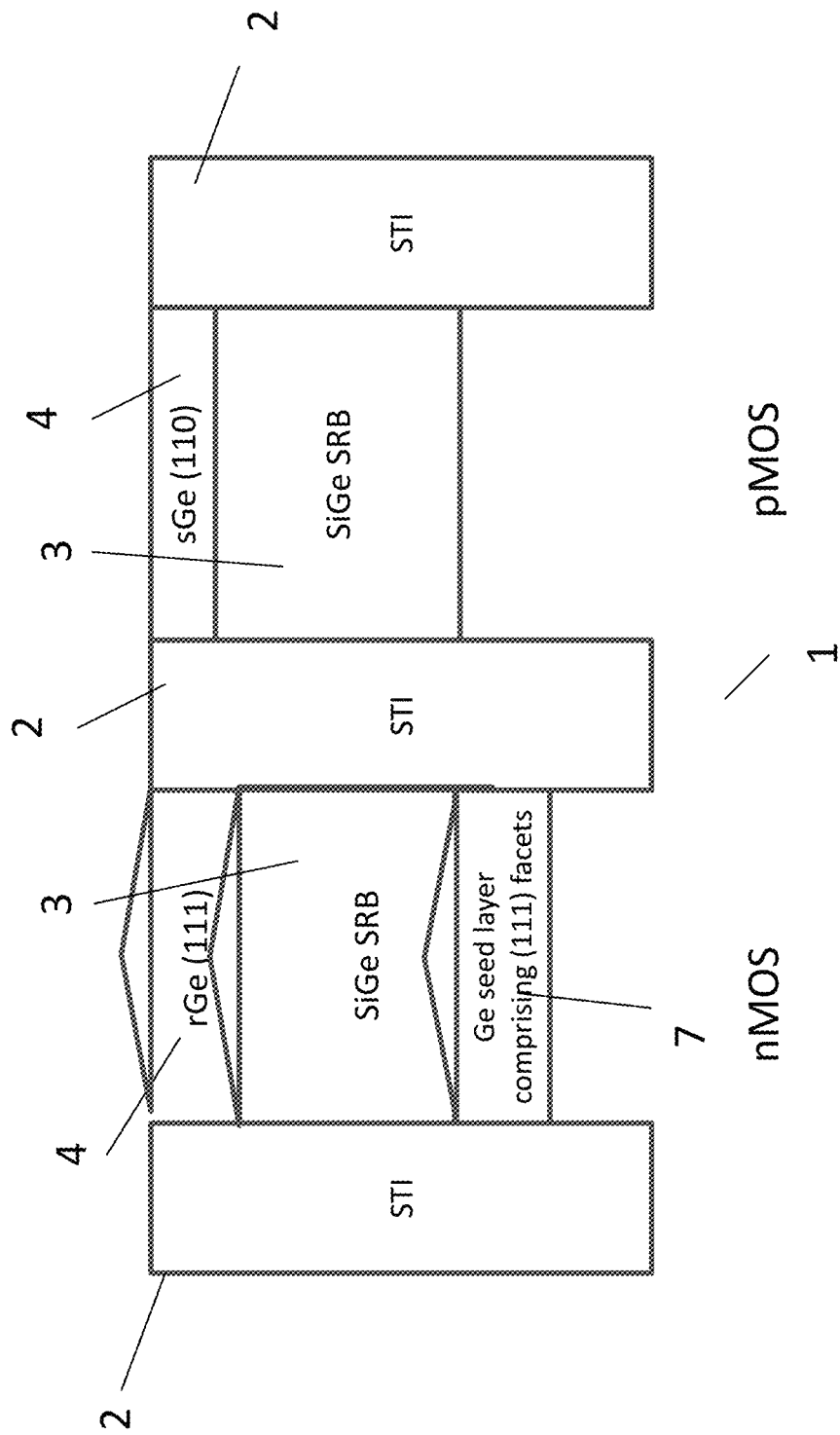
FIG. 3 illustrates an embodiment of the present disclosure.

In FIG. 3, an embodiment of the present invention is illustrated. Here, a (111)-facetted relaxed Ge channel (111) is grown for an nFinFET (NMOS device), complementary to a strained Ge channel for a pFinFET (PMOS device), preferably simultaneously. The disclosed method can use Ge as a seed layer in an NMOS region prior to the typical rSiGe(SRB) layer/strained Ge layer growths, which are generally used for pFET structures, in both an NMOS and PMOS region.

FIG. 3 depicts parts of a CMOS device on a silicon substrate 1 according to embodiments of the present invention, which comprises an NMOS device according to embodiments of the present invention. The CMOS device comprises a silicon substrate comprising an NMOS device and a PMOS device.

The NMOS transistor device comprises: a trench 10 having sidewalls defined by a dielectric material structure 2 and abutting on a silicon substrate's surface; a seed layer 7 in the trench 10 on the surface, the seed layer 7 having a front surface comprising facets having a (111) orientation; a strain-relaxed buffer layer 3 in the trench 10 on the seed layer 7, the strain-relaxed buffer layer 3 comprising silicon germanium; a channel layer 4 comprising germanium on the strain-relaxed buffer layer 3, the channel layer 4 having a (111) orientation in the trench 10.

The PMOS transistor device comprises: a second trench 10 having sidewalls defined by a dielectric material structure 2 and abutting on the silicon substrate's surface which defines a bottom surface of the second trench 10; the strain-relaxed buffer layer 3 in the second trench 10; the channel layer 4 comprising germanium on the strain-relaxed buffer layer in the second trench, the channel layer having a (110) sidewall orientation and (001) top surface orientation.

Preferably, the common channel layer 4 comprises tensile strain or is unstrained in the NMOS region and comprises compressive strain in the PMOS region.

Figure 4:
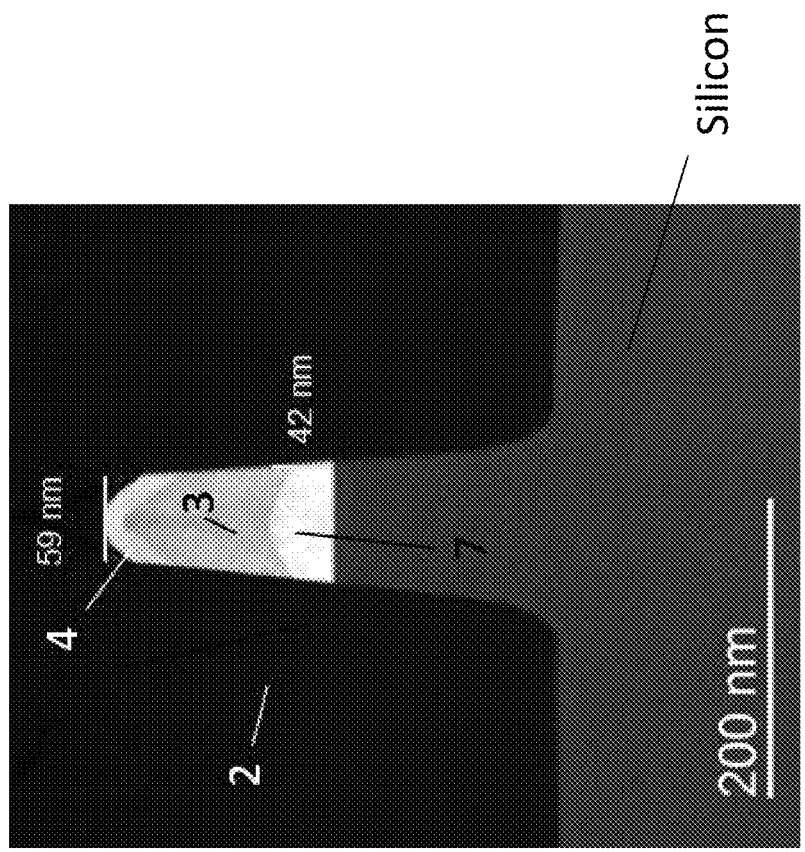
FIG. 4 embodies a TEM image of a component of transistor structure according to embodiments of the present disclosure.

FIG. 4 is a high-angle annular dark-field imaging scanning transmission electron microscopy (HAADF-STEM) image taken on a similar sample, which shows that the $Si_{0.25}Ge_{0.75}$ SRB has a slight non-uniformity in composition, which is reflected by the different contrast close to the edge versus the center of the trench. This slight Ge non-uniformity (±3% as confirmed by EDS, Energy-dispersive X-ray spectroscopy) is explained by facet formation during $Si_{0.25}Ge_{0.75}$ Selective epitaxial growth. The Ge incorporation varies as function of the surface orientation of the growing surface and is higher on (111) surfaces than on (001) surfaces. Below the $Si_{0.25}Ge_{0.75}$ SRB, the layer 7 stands for the facetted seed layer which is pure Ge in this example. The top layer 4 is the (111)-facetted channel (here Ge) in which the carrier transport occurs.

Figure 5:
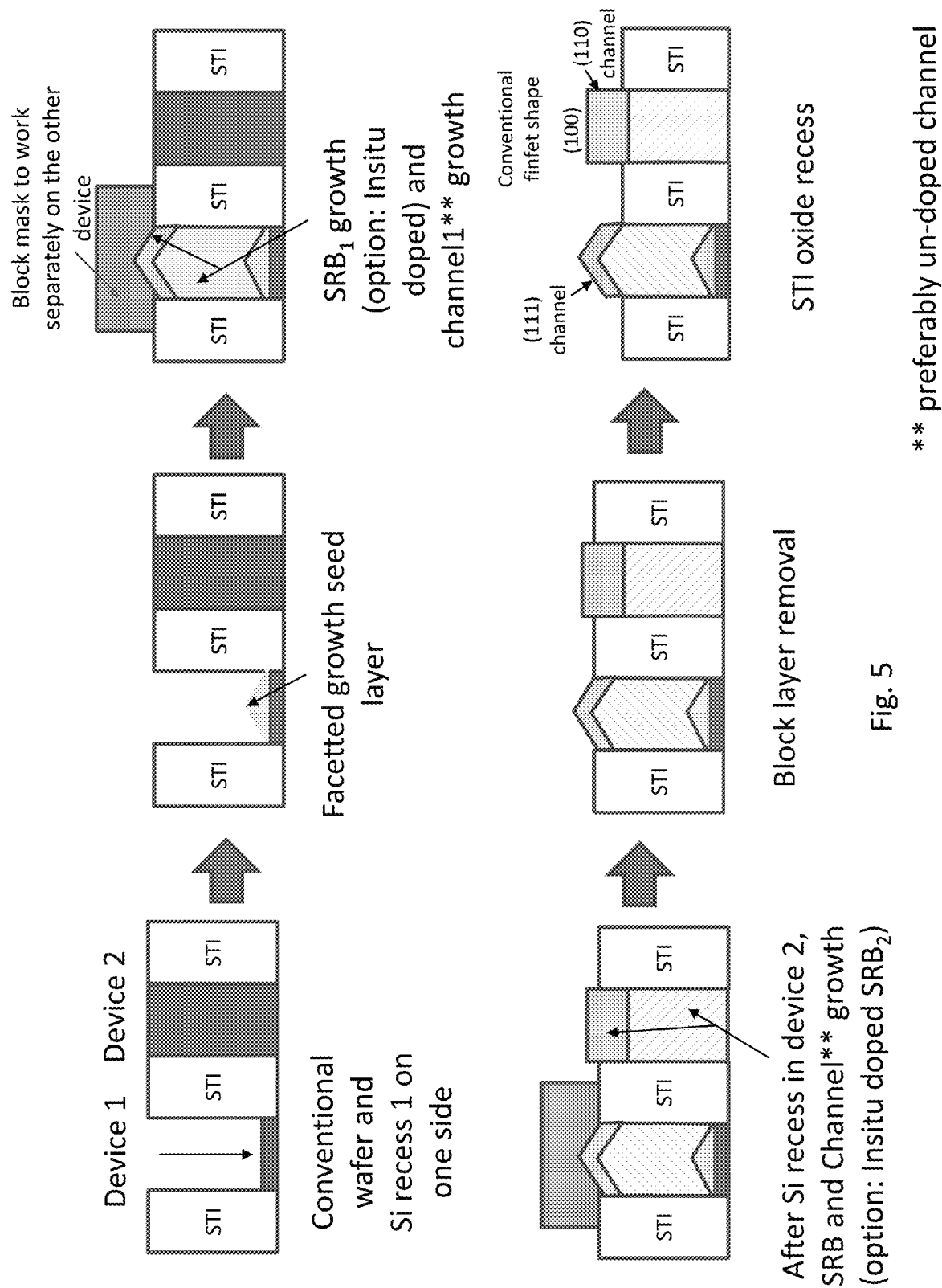
FIG. 5 shows a possible CMOS-compatible process flow using the seed layer concept. The nFinFET or the pFinFET are defined separately.

FIG. 5 depicts a process flow to define fins aiming at fabricating CMOS transistors. We start, after a selective recess of the Si material (preferably on the nFinFETs side), with the seed layer growth which is properly facetted (e.g. (111)-oriented). As mentioned in the previous embodiments, additional thermal treatment can be performed at this stage. It is followed by the SRB growth preferentially in-situ doped and then, the channel layer growth. After covering the nFinFETs by an oxide layer for instance, the process of the other device can be done (e.g. the pFinFET in this example). A similar processing sequence is carried out (Si recess, SRB and Ge growth) but this time, without the seed layer growth. At the end of the fins process and after STI oxide recess to unveil the fin, a (111)-Ge channel is fabricated while the shape of the companion device is standard (e.g. preferentially (100)-Ge on top, (111)-Ge on the sidewalls).

Figure 6:
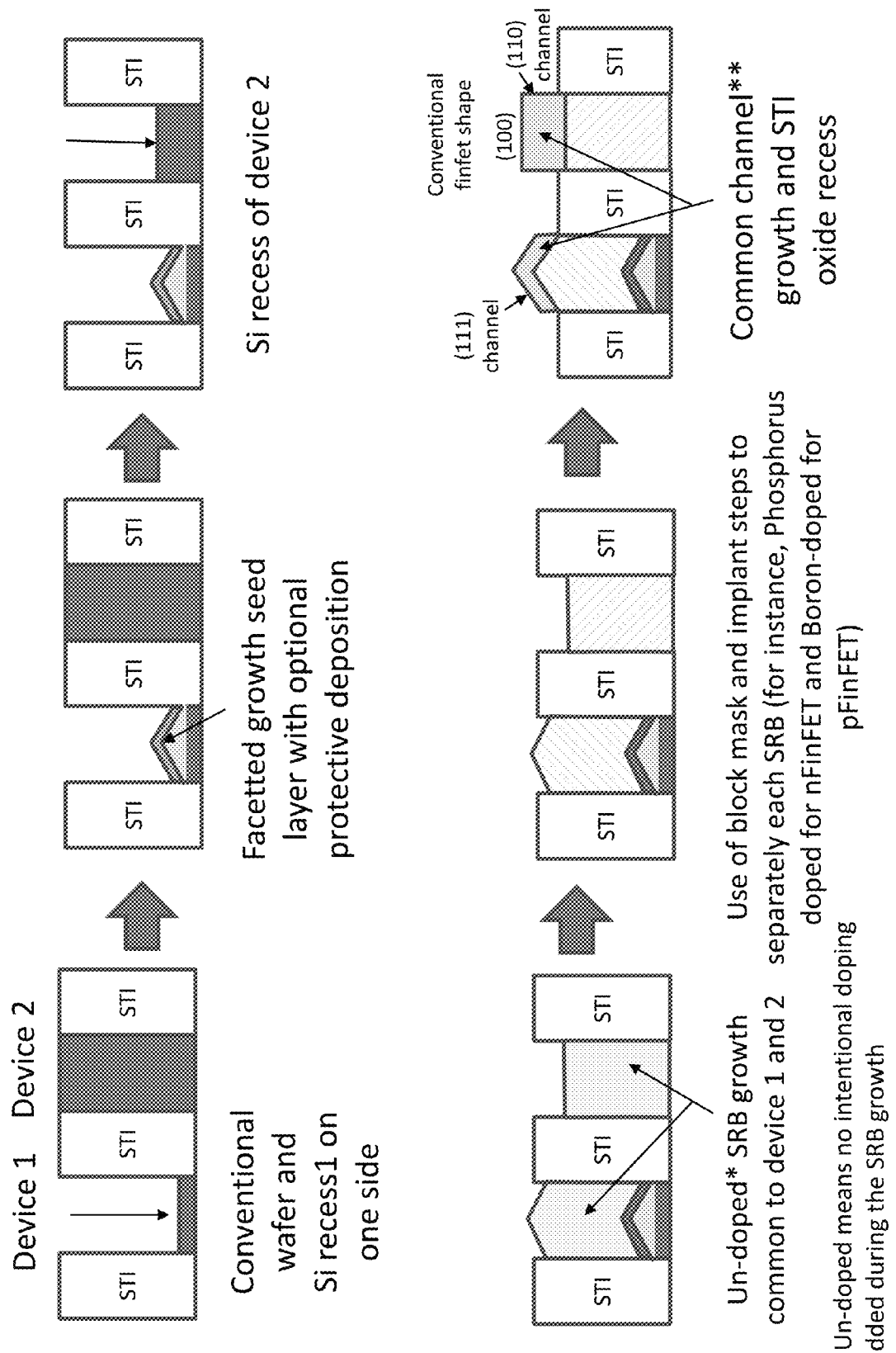
FIG. 6 shows a possible CMOS-compatible process flow using the seed layer concept. The nFinFET or the pFinFET have common SRB and Ge layers.

FIG. 6 depicts an alternative way of defining CMOSFET-compatible fins to that of described in relation to FIG. 5. It is based on a use of common SRB and channel layers. We start, after a selective recess of the Si material (preferably on the nFinFETs side), with the seed layer growth which is properly facetted (e.g. (111)-oriented). It is followed by the growth of a capping layer aiming at protecting the seed layer from chemical attacks (the capping layer is preferably grown after the seed layer step to avoid surface contamination of the seed layer). Subsequently, the Si recess of the device companion (pFinFETs in this example) can be carried out. The growth of an un-doped SRB is done. Selective doping of these SRB layers can be conducted either for n or pFinFETs with well-established techniques. After proper cleans of the SRB surface, an un-doped growth of the channel layer can be performed in both n and pFinFETs.

While certain embodiments of the inventions have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A method of forming a transistor device, the method comprising:
    providing a trench having sidewalls defined by a dielectric material structure and abutting on a silicon substrate's surface;
    growing a seed layer in the trench on the surface, the seed layer having a front surface comprising facets having a (111) orientation;
    growing a strain-relaxed buffer (SRB) layer in the trench and on the seed layer, the strain-relaxed buffer layer comprising silicon germanium (SiGe); and
    growing a strain-relaxed germanium channel layer on the strain-relaxed buffer layer.

2. The method according to claim 1, further comprising applying a thermal anneal step before growing the strain-relaxed buffer layer.

3. The method according to claim 1, wherein the seed layer is a germanium-based seed layer.

4. The method according to claim 1, further comprising:
    providing a second trench having sidewalls defined by a second dielectric material structure and abutting on the silicon substrate's surface which defines a bottom surface of the second trench;
    growing a second strain-relaxed buffer layer in the second trench; and
    growing a compressively strained germanium channel layer on the second strain-relaxed buffer layer in the second trench.

5. The method according to claim 4, wherein the strain-relaxed buffer layer and the second strain-relaxed buffer layer are formed simultaneously after growing the seed layer and are formed of the same material.

6. The method according to claim 4, wherein the strain-relaxed germanium channel layer and the compressively strained germanium channel layer are formed simultaneously and are formed of the same material.

7. The method according to claim 6, wherein the seed layer is a Ge layer or a SiGe layer.

8. The method according to claim 6, wherein an equilibrium lattice constant of the SRB layer is greater than an equilibrium lattice constant of the strain-relaxed germanium channel layer, and the SRB layer has a composition and a thickness such that the SRB layer is fully relaxed, and such that the strain-relaxed germanium channel layer is under a tensile strain.

9. The method according to claim 6, wherein an equilibrium lattice constant of the second SRB layer is smaller than an equilibrium lattice constant of the compressively strained germanium channel layer, and the second SRB layer has a composition and a thickness such that the second SRB layer is strained, and such that the compressively strained germanium channel layer is under a compressive strain.

10. The method according to claim 4, wherein providing the trench and the second trench comprises recessing silicon protrusions interposed between shallow trench isolation (STI) structures formed in the silicon substrate, and wherein recessing to form the second trench is performed after growing the seed layer.

11. A semiconductor transistor device, comprising:
    a trench having sidewalls defined by a dielectric material structure and abutting on a silicon substrate's surface;
    a seed layer formed in the trench on the surface, the seed layer having a front surface comprising facets having a (111) orientation;

a strain-relaxed buffer (SRB) layer formed in the trench on the seed layer, the strain-relaxed buffer layer comprising silicon germanium; and a strain-relaxed germanium channel layer formed on the strain-relaxed buffer layer, the strain-relaxed germanium channel layer having a (111) orientation in the trench.

12. The device according to claim 11, wherein the seed layer is a germanium seed layer or a SiGe seed layer.

13. The device according to claim 11, wherein an equilibrium lattice constant of the SRB layer is greater than an equilibrium lattice constant of the strain-relaxed germanium channel layer, and the SRB layer is fully relaxed such that the strain-relaxed germanium channel layer is under a tensile strain.

14. A semiconductor transistor device, comprising:
an n-channel metal-oxide-silicon (NMOS) transistor device, comprising:
a trench having sidewalls defined by a dielectric material structure and abutting on a silicon substrate's surface,
a seed layer formed in the trench on the surface, the seed layer having a front surface comprising facets having a (111) orientation,
a strain-relaxed buffer (SRB) layer formed in the trench on the seed layer, the strain-relaxed buffer layer comprising silicon germanium, and
a channel layer comprising germanium formed on the strain-relaxed buffer layer, the channel layer having a (111) orientation in the trench; and
a p-channel metal-oxide-silicon (PMOS) transistor device, comprising:
a second trench having sidewalls defined by a dielectric material structure and abutting on the silicon substrate's surface which defines a bottom surface of the second trench;
the strain-relaxed buffer (SRB) layer further formed in the second trench; and
the channel layer further formed on the strain-relaxed buffer layer in the second trench, the further formed channel layer having a (110) side-wall orientation and (001) top surface orientation.

15. The device of claim 14, wherein an equilibrium lattice constant of the SRB layer further formed in the second trench is smaller than an equilibrium lattice constant of the channel layer further formed in the second trench, and the SRB layer in the second trench is fully relaxed such that channel layer is under a compressive strain.

16. The method of claim 4, wherein forming the strain-relaxed germanium channel layer comprises forming facets having a (111) orientation, and
wherein forming the compressively strained germanium channel layer comprises forming sidewalls having a (110) orientation and a top surface having a (001) orientation.

17. The device of claim 11, further comprising:
a second trench having sidewalls defined by a dielectric material structure and abutting on the silicon substrate's surface which defines a bottom surface of the second trench;
the strain-relaxed buffer (SRB) layer further formed in the second trench; and
a compressively strained germanium channel layer formed on the strain-relaxed buffer layer in the second trench.

18. The device of claim 17, wherein each of the strain-relaxed germanium channel layer and the strained germanium channel layer is undoped.

19. The device of claim 11, wherein the trench has a bottom surface having an orientation such that surfaces of the strain-relaxed germanium channel layer having the (111) orientation and the bottom surface of the trench are formed in intersecting planes.

* * * * *